(12) United States Patent
Shao et al.

(10) Patent No.: US 10,599,805 B2
(45) Date of Patent: Mar. 24, 2020

(54) SUPERCONDUCTING QUANTUM CIRCUITS LAYOUT DESIGN VERIFICATION

(71) Applicant: INTERNATIONAL BUSINESS MACHINES CORPORATION, Armonk, NY (US)

(72) Inventors: Dongbing Shao, Wappingers Falls, NY (US); Markus Brink, White Plains, NY (US); Salvatore B. Olivadese, Stamford, CT (US); Jerry M. Chow, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/828,623

(22) Filed: Dec. 1, 2017

(65) Prior Publication Data

US 2019/0171784 A1    Jun. 6, 2019

(51) Int. Cl.
*G06F 17/50* (2006.01)
*G03F 1/36* (2012.01)
*G06N 10/00* (2019.01)

(52) U.S. Cl.
CPC ............ *G06F 17/5068* (2013.01); *G03F 1/36* (2013.01); *G06F 17/5022* (2013.01); *G06F 17/5036* (2013.01); *G06F 17/5081* (2013.01); *G06N 10/00* (2019.01)

(58) Field of Classification Search
CPC . G06N 10/00; G06F 17/5009; G06F 17/5022; G06F 17/5045; G06F 17/5068; G06F 17/5081
USPC .......................................... 716/106, 110, 119
See application file for complete search history.

(56) References Cited

U.S. PATENT DOCUMENTS

| | | |
|---|---|---|
| 6,732,340 B1 | 5/2004 | Akashi |
| 8,185,856 B2 | 5/2012 | Izuha |
| 8,381,160 B2 | 2/2013 | Izuha |
| 8,930,869 B2 | 1/2015 | Ohtsuka et al. |
| 9,344,092 B2 | 5/2016 | Abraham et al. |
| 9,361,424 B2 | 6/2016 | Robles |
| 9,652,571 B2 | 5/2017 | Shauck et al. |

(Continued)

FOREIGN PATENT DOCUMENTS

| WO | 2016081788 A1 | 5/2016 |
|---|---|---|
| WO | 2017053986 A1 | 3/2017 |

OTHER PUBLICATIONS

IBM: List of IBM Patents or Patent Applications Treated as Related (Appendix P), Mar. 14, 2018, 2 pages.

(Continued)

*Primary Examiner* — Paul Dinh
(74) *Attorney, Agent, or Firm* — Teddi E. Maranzano

(57) ABSTRACT

Verifying a quantum circuit layout design is provided. A qubit layout is received as input. The qubit layout is generated from a qubit schematic. The qubit schematic includes a plurality of qubits, a plurality of coupling buses, a plurality of readout buses, and a plurality of readout ports. Design rules checking is performed on the qubit layout input, using a predefined set of design rule. The bus style/frequency and qubit information are extracted from the qubit layout input. A new qubit schematic is generated from the extracted bus style/frequency and qubit information. The qubit layout is verified based on the new qubit schematic being the same as the qubit schematic.

17 Claims, 6 Drawing Sheets

(56) References Cited

U.S. PATENT DOCUMENTS

| | | |
|---|---|---|
| 2006/0123363 A1 | 6/2006 | Williams et al. |
| 2009/0014714 A1 | 1/2009 | Koch |
| 2011/0057169 A1 | 3/2011 | Harris et al. |
| 2014/0026107 A1* | 1/2014 | Bocharov ............ G06F 17/5045 716/101 |
| 2014/0157214 A1* | 6/2014 | Ahn ....................... B82Y 10/00 716/102 |
| 2014/0264284 A1* | 9/2014 | Abraham ............... B82Y 10/00 257/31 |
| 2016/0364653 A1* | 12/2016 | Chow .................... H01L 25/04 |
| 2017/0017742 A1 | 1/2017 | Oberg et al. |
| 2017/0193388 A1 | 7/2017 | Filipp |
| 2017/0228483 A1* | 8/2017 | Rigetti .................... G06N 7/00 |

OTHER PUBLICATIONS

Pending U.S. Appl. No. 15/828,613, filed Dec. 1, 2017, entitled: "Automatic Design Flow From Schematic to Layout for Superconducting Multi-Qubit Systems", 24 pages.

* cited by examiner

SUPERCONDUCTING QUANTUM CIRCUITS LAYOUT DESIGN VERIFICATION

BACKGROUND

The present invention relates to fabrication of quantum computing devices, and more specifically, to verification of a design layout for multi-qubit systems.

In quantum computing, a qubit or quantum bit is a unit of quantum information, the quantum analogue of the classical bit. A qubit is a two-state quantum-mechanical system, such as the polarization of a single photon: here the two states are vertical polarization and horizontal polarization. In a classical system, a bit would have to be in one state or the other. However, quantum mechanics allows the qubit to be in a superposition of both states at the same time, a property that is fundamental to quantum computing. Several implementations of quantum computers are based on superconducting circuits. These types of implementations typically contain Josephson Junctions. The properties of the Josephson Junction can have significant effect on the performance of the circuits.

BRIEF SUMMARY

Embodiments of the invention may provide a method, system, and computer program product for verifying a quantum circuit layout design. A qubit layout is received as input. The qubit layout can be automatically generated from a qubit schematic. Alternatively, the qubit layout can be modified from an existing qubit layout, or the qubit layout can be manually designed. The qubit schematic includes a plurality of qubits, a plurality of coupling buses, a plurality of readout buses, and a plurality of readout ports. Design rules checking is performed on the qubit layout input, using a predefined set of design rules. The bus style/frequency and qubit information are extracted from the qubit layout input. A new qubit schematic is generated from the extracted bus style/frequency and qubit information. The qubit layout is verified by first extracting the schematic from the layout, and then matching the result to the intended design schematic, if there is one.

DETAILED DESCRIPTION

Figure 1:
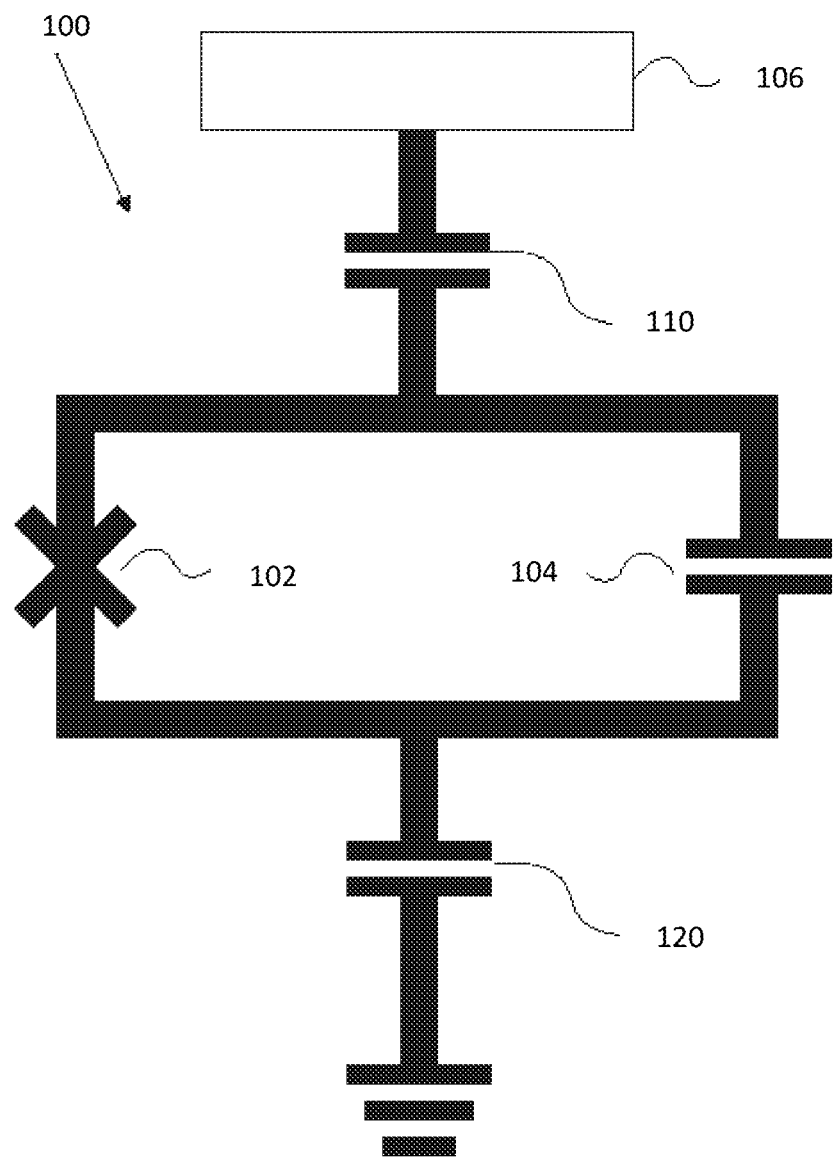
FIG. 1 illustrates an example qubit circuit diagram, in accordance with embodiments of the present disclosure.

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Multi-qubit chips are necessary in creating quantum computing systems. However, each qubit added to a chip also adds to the design complexity of the chip, as a qubit may interact with other proximal qubits when their resonance frequency and anharmonicity obey certain relationships. Such behavior constitutes a failure mode known as a 'frequency collision.' In current practice, microwave resonators, i.e., the coupling buses and readout resonators, occupy a large portion of the multi-qubit layout. Additionally, the resonators are manually drawn by a layout engineer before submitting the layout for verification. This manual process is both time consuming and error prone, potentially requiring re-work. Further, the amount of time currently required to manually draw or verify a layout having 10-20 qubits hinders experimentation in design layouts having a greater number of qubits. To continue the growth in qubit density on design layouts, it is desirable to automate design flow such that a design layout generation can be measured in hours rather than in weeks. Similarly, it is desirable to automate the verification of the design layout to ensure that it correctly corresponds to the design intentions of the original schematic. The verification includes inputting the design layout and the original schematic, if there is one, and performing design rules checking for physical verification of the design layout versus the original schematic. When any errors in the design layout are identified and corrected, the design layout undergoes additional layout verification to generate an output schematic. When errors identified during this schematic generation are corrected, the output schematic is the same as the input schematic.

FIG. 1 illustrates an example qubit 100, in accordance with embodiments of the present disclosure. In some embodiments, the qubit 100 contains a Josephson Junction 102, and a capacitor 104 connected in parallel with one another as shown in FIG. 1. The parallel Josephson Junction 102 and capacitor 104 arrangement is capacitively coupled by a coupling capacitor 110 to structure 106, as well as capacitively coupled by a coupling capacitor 120 to ground. While only a single structure is shown capacitively coupled to the Josephson Junction 102 and capacitor 104, multiple structures may be attached to the parallel Josephson Junction 102 and capacitor 104 arrangement depicted. For example, a readout structure and interconnects to other qubit structure may each be capacitively connected to the parallel Josephson Junction 102 and capacitor 104 arrangement. Additionally, while qubit 100 is depicted as using coupling capacitor 110 and coupling capacitor 120, other methods of electrically connecting the qubit may be used.

Figure 2:
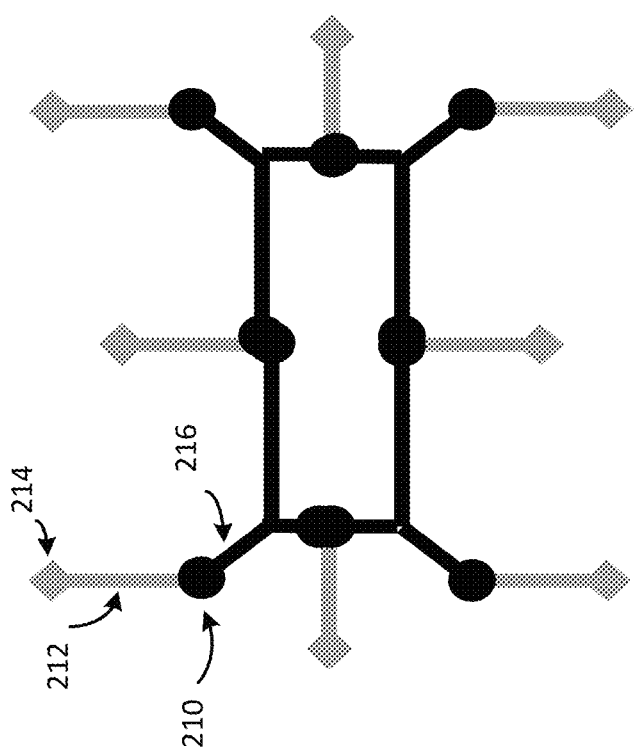
FIG. 2 illustrates an example qubit schematic, in accordance with embodiments of the present disclosure.

FIG. 2 illustrates an example schematic having multiple capacitively coupled qubits as depicted in FIG. 1, in accordance with embodiments of the present disclosure. Each qubit 210 is connected to one or more qubits 210 by a coupling bus 216. The readout bus 212 is connected to a readout port 214 through which the qubit can be addressed and the qubit state can be read.

Figure 3:
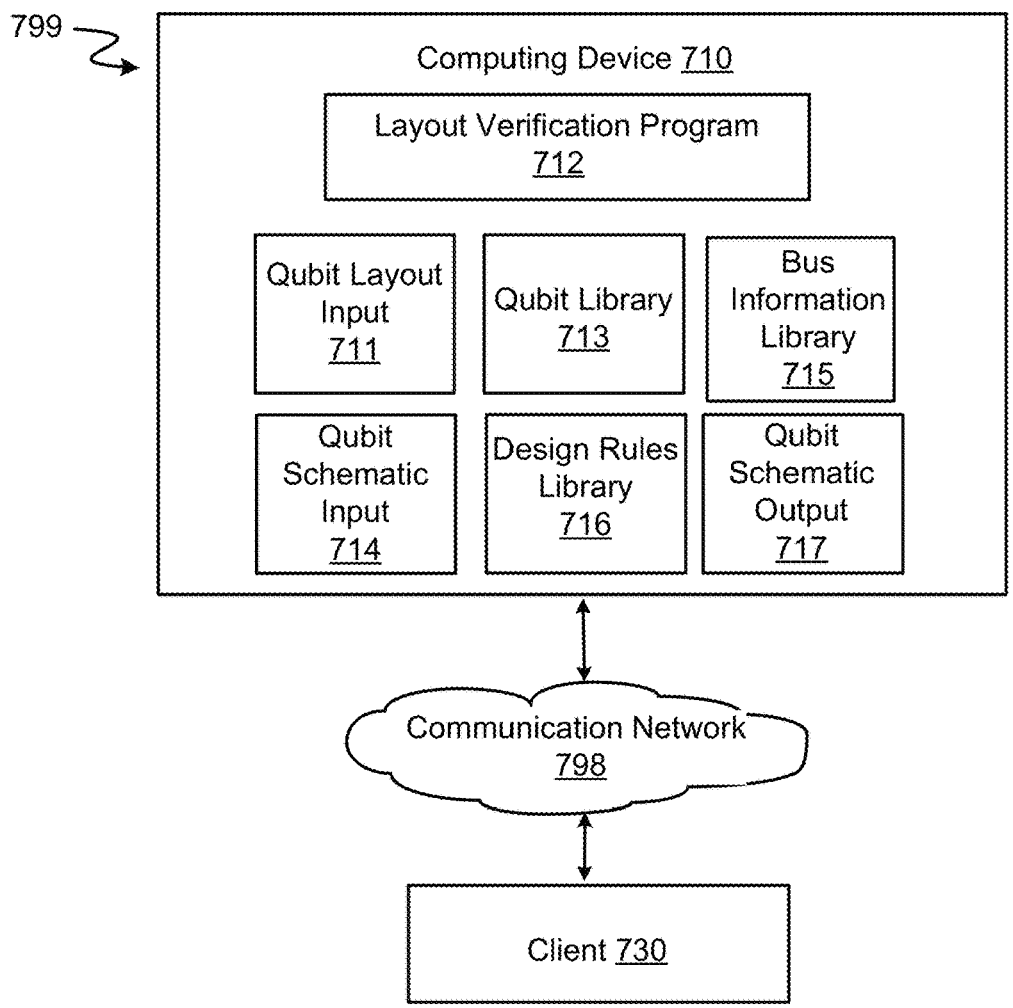
FIG. 3 illustrates a layout verification system, in accordance with embodiments of the invention.

FIG. 3 illustrates a qubit layout verification system, in accordance with embodiments of the invention. In an example embodiment, layout verification system 799 includes computing device 710 and client 730 interconnected via a communication network 798.

Network 798 may include, for example, wired, wireless or fiber optic connections. In an embodiment, network 798 may be implemented as an intranet, a local area network (LAN), or a wide area network (WAN). In general, network 798 can be any combination of connections and protocols that will support communications between the computing device 710 and the client 730.

Computing device 710 includes several input and output libraries for use by the layout verification program 712 in verifying that the qubit layout input 711, as generated by a schematic layout generation program, conforms to the design intention of the original schematic. In the example embodiment, computing device 710 may include a desktop computer, a notebook or a laptop computer or any other electronic device or computing system capable of communicating with the client 730 via network 798, and performing the computations necessary to operate the layout verification program 712. While computing device 710 is depicted as a single device, the programs located on the computing device 710 may be located on separate devices communicating with each other, or additionally a program may be operated on a plurality of computing devices, such as client 730. Computing device 710 and client 730 are described in more detail with reference to FIGS. 4 and 5.

The computing device 710 includes the qubit library 713, the bus information library 715, the design rules library 716, the qubit layout input 711 and the qubit schematic input 714. The qubit library 713 and the bus information library 715 include templates for components that generated the qubit layout input 711 from a qubit schematic. For example, the qubit library 713 includes standard qubit design styles. A qubit design may specify, for example, how many Josephson Junctions and their arrangement on the particular qubit. The bus information library 715 includes styles and frequency information for a variety of possible bus designs. For example, a bus may connect to two qubits one on each end of the bus, or multiple qubits may be connected by the same bus. The bus information library 715 can include various bus types and boundary conditions, such as stepped impedance, quarter wave, or half wave. The design rules library 716 includes predefined technology rules for physical verification of the qubit layout input 711 versus the original qubit schematic, here shown as qubit schematic input 714.

Layout verification program 712 receives qubit layout input 711, the qubit library 713, the bus information library 715, and the design rules library 716. The layout verification program 712 can automatically select the design rules, qubit design information, and bus information from the input libraries, or the library input may be manually selected from a displayed list of possible input.

The layout verification program 712 performs design rule checking, using rules included in the design rules library 716. Design rules include, but are not limited to, a minimum width of a bus, an exact width of a bus, minimum amount of space between buses, and exact space measurement between buses, space requirements between a bus and a qubit, space requirements between same and different types of busses. Design rule checking identifies physical errors in the qubit layout input 711 using the rules included in the design rules library 716. A violation of the design rules is an error, and is reported. If, after review, the violation is identified as a true violation, the design is repaired so that the design rule checking executes successfully. Following error identification and correction, the layout verification program 712 extracts and identifies components from the qubit layout input 711, using the qubit library 713 and bus information library 715. For example, qubits in the qubit layout input 711 are checked by matching them against corresponding entries in the qubit library 713. Bus designs are checked using the style of the bus and bus design parameters that are input to the layout verification program 712. The operations and functions of layout verification program 712 are described in further detail below with regard to FIGS. 4 and 5.

Figure 4:
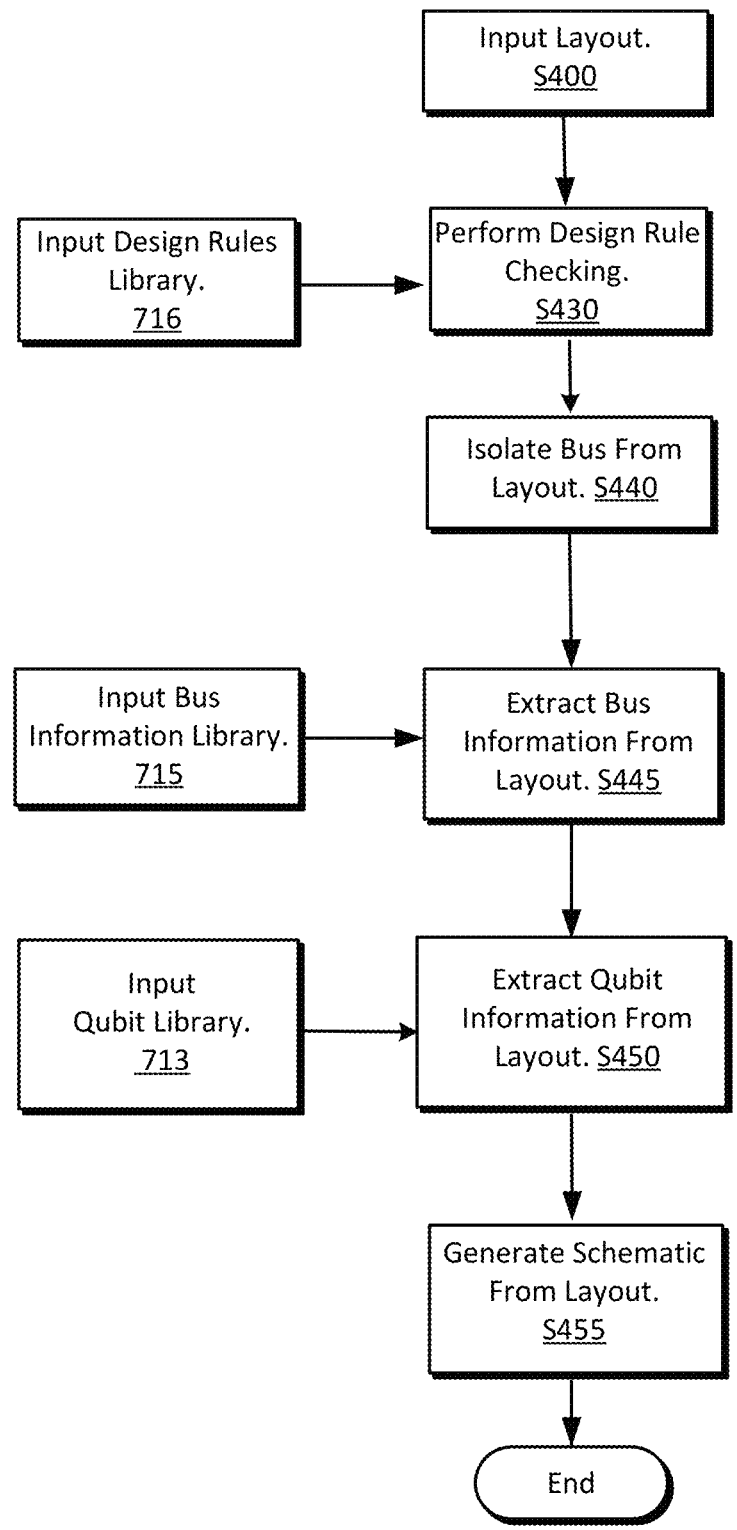
FIG. 4 is a flowchart illustrating the operations of the layout verification system of FIG. 3, in accordance with embodiments of the invention.

FIG. 4 is a flowchart illustrating the operations of the layout verification system of FIG. 3, in accordance with embodiments of the invention.

Referring to step S400, a multi-qubit design layout for verification against a multi-qubit schematic is received as input. In an embodiment, the input schematic is output from another electronic design automation (EDA) tool.

At S430, design rule checking is performed against the qubit layout input 711, using predefined rules from the design rules library 716. The predefined rules may be specific to the fabrication process. A design rule set specifies certain geometric and connectivity restrictions to ensure sufficient margins to account for variability in the manufacturing processes. The qubit layout input 711 may be input as Graphic Database System II (GDSII) format. S430 verifies physical characteristics of the qubit layout input 711, including but not limited to, shorts violations, misaligned via wires, and spacing violations. A report of design rules violations is produced for evaluation and correction.

At S440, the layout verification program 712 begins to extract bus information for each bus into an intermediate layout from the qubit layout input 711. In the qubit layout input 711, geometries of individual layers can be represented as polygons, each defined as a set of edges. The bus extraction can be performed by isolating the center pin from a coplanar waveguide. Alternatively, the bus extraction can be performed by removing the center pin from a coplanar waveguide, and performing a logical NOT operation using the qubit layout input 711, resulting in the intermediate layout that has the qubit information of the qubit layout input 711 removed, but leaves the bus information.

At S445, each bus in the intermediate layout is examined. The bus frequency and bus type information is examined. The bus frequency can be determined from the bus length which can be extracted from the intermediate layout. Additional bus frequency information can be read from the bus information library 715 to supplement bus frequency and bus style information extracted from the qubit layout input 711. A more accurate bus frequency could be determined from RF simulation. For example, a quarter wave bus type must be grounded on one of its ends, and a half wave bus has a coupling capacitor at each of its ends, for example, to a qubit or to a port or to a feedline. Finally, physical simulation is performed to check unwanted hidden modes. Physical RF simulation is performed on the intermediate bus layout to check all RF modes. If unwanted hidden modes are identified, manual review and modification is performed to remove them.

At S450, the layout verification program 712 locates each qubit on the qubit layout input 711. For each qubit, layout verification program 712 can extract qubit information by recognizing the qubit cell name, or by pattern matching the qubit with the input qubit library 713. A unit cell is a repeating pattern of qubits and connections.

At S455, the layout verification program 712 automatically generates a new qubit schematic output 717 using bus type and frequency, and qubit information identified during the previous extractions. The qubit schematic output 717 is compared with the qubit schematic input 714 which generated the qubit layout input 711 being verified. Deviations from the original qubit schematic input 714 can be reported and repaired as needed. The connectivity between a bus and the qubits needs to be extracted in this step. For example, S455 identifies which bus connects with which qubits.

Figure 5:
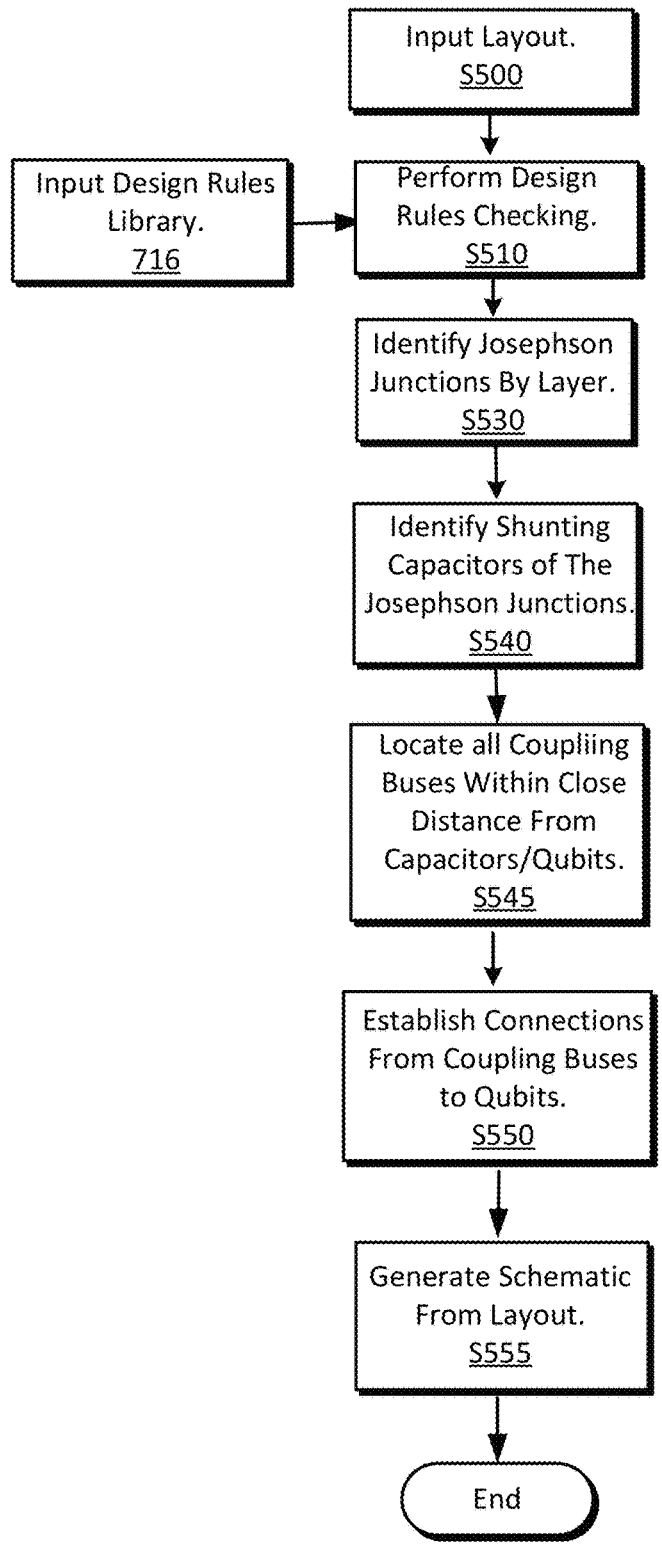
FIG. 5 is a flowchart illustrating operation of an alternative layout verification system of FIG. 3, in accordance with embodiments of the invention.

FIG. 5 is a flowchart illustrating the operation of an alternative layout verification system of FIG. 3, in accordance with embodiments of the invention. In FIGS. 5, S500 and S510 perform substantially similar operations as discussed previously with respect to S400 and S430 of FIG. 4. The embodiment of FIG. 5 is performed without the input qubit library 713 and the bus information library 715. At S530, the layout verification program 712 can identify a Josephson Junction because two layers are typically reserved for each Josephson Junction in a qubit. At S540, the layout verification program 712 identifies the Josephson Junction shunting capacitors. These are any metal layer objects that are connected to the Josephson Junction. Typically, the qubit comprises the Josephson Junction and the shunting capacitors. Within the qubit region, the layout verification program 712 locates an end of a RF coupling bus (S545). A qubit region can be defined as the distance around the capacitors where signals can be sent and received from the qubit. From the one bus end, the layout verification program 712 traces the bus to the other end (or ends if a bus connects to multiple qubits), thereby establishing connectivity of the design (S550). The connectivity includes from coupling buses to other qubits, to I/O coupling capacitors, or to feedlines for multiplexed readouts. The connectivity information can also be extracted from computer aided design (CAD) programs. The layout verification program 712 then generates the schematic from the information extracted from the qubit layout input 711. The design is verified the schematic extracted from the qubit layout input 711 matches topologically or functionally, the intended design schematic, i.e., the qubit schematic input 714.

Figure 6:
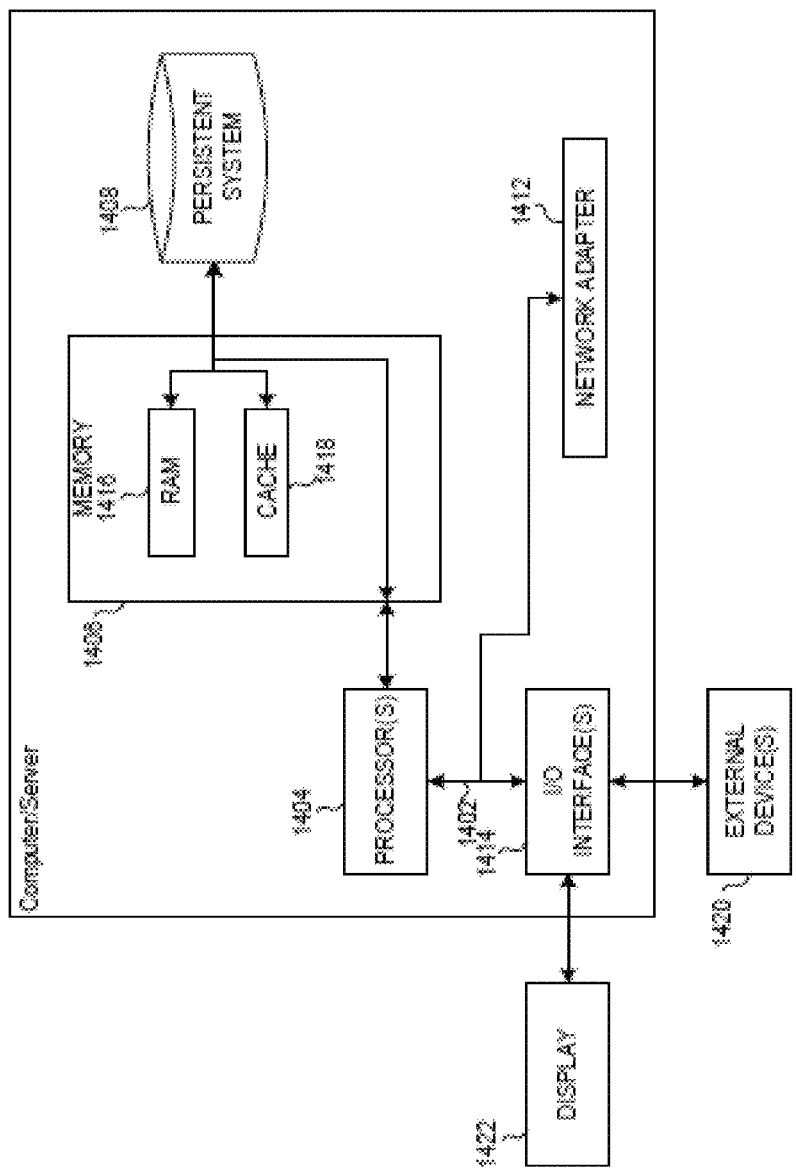
FIG. 6 is a block diagram depicting the hardware components of the qubit schematic layout system of FIG. 3, in accordance with embodiments of the invention.

FIG. 6 depicts a block diagram of components of computing device 710 and client 730, in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Computing device 710 and client 730 include communications fabric 1402, which provides communications between computer processor(s) 1404, memory 1406, persistent storage 1408, communications unit 1412, and input/output (I/O) interface(s) 1414. Communications fabric 1402 can be implemented with any architecture designed for passing data and/or control information between processors (such as microprocessors, communications and network processors, etc.), system memory, peripheral devices, and any other hardware components within a system. For example, communications fabric 1402 can be implemented with one or more buses.

Memory 1406 and persistent storage 1408 are computer-readable storage media. In this embodiment, memory 1406 includes random access memory (RAM) 1416 and cache memory 1418. In general, memory 1406 can include any suitable volatile or non-volatile computer-readable storage media.

The schematic layout program 712, qubit library 713, qubit layout input 711, bus information library 715, qubit schematic input 714, design rules library 716, and qubit schematic output 717 in computing device 710 are stored in persistent storage 1408 for execution by one or more of the respective computer processors 1404 via one or more memories of memory 1406. In this embodiment, persistent storage 1408 includes a magnetic hard disk drive. Alternatively, or in addition to a magnetic hard disk drive, persistent storage 1408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 1408 may also be removable. For example, a removable hard drive may be used for persistent storage 1408. Other examples include optical and magnetic disks, thumb drives, and smart cards that are inserted into a drive for transfer onto another computer-readable storage medium that is also part of persistent storage 1408.

Communications unit 1412, in these examples, provides for communications with other data processing systems or devices. In these examples, communications unit 1412 includes one or more network interface cards. Communications unit 1412 may provide communications through the use of either or both physical and wireless communications links. The schematic layout program 712, qubit library 713, qubit layout input 711, bus information library 715, qubit schematic input 714, design rules library 716, and qubit schematic output 717 in computing device 710 may be downloaded to persistent storage 1408 through communications unit 1412.

I/O interface(s) 1414 allows for input and output of data with other devices that may be connected to computing device 710. For example, I/O interface 1414 may provide a connection to external devices 1420 such as a keyboard, keypad, a touch screen, and/or some other suitable input device. External devices 1420 can also include portable computer-readable storage media such as, for example, thumb drives, portable optical or magnetic disks, and memory cards. Software and data used to practice embodiments of the present can be stored on such portable computer-readable storage media and can be loaded onto persistent storage 1408 via I/O interface(s) 1414. I/O interface(s) 1414 can also connect to a display 1422.

Display 1422 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While steps of the disclosed method and components of the disclosed systems and environments have been sequentially or serially identified using numbers and letters, such numbering or lettering is not an indication that such steps must be performed in the order recited, and is merely provided to facilitate clear referencing of the method's steps. Furthermore, steps of the method may be performed in parallel to perform their described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of verifying a quantum circuit layout design, the method comprising:
   receiving, by a computer, a qubit layout input generated from a qubit schematic, wherein the qubit schematic includes a plurality of qubits, a plurality of coupling buses, a plurality of readout buses, and a plurality of readout ports;
   performing, by the computer, design rules checking on the qubit layout input, using a predefined set of design rules;
   extracting, by the computer, bus style/frequency and qubit information from the qubit layout input;
   generating, by the computer, a new qubit schematic from the extracted bus style/frequency and qubit information; and
   verifying, by the computer, the qubit layout input, wherein the verifying comprises:
   extracting the qubit schematic from the qubit layout input; and
   matching the extracted qubit schematic to an intended design schematic.

2. The method of claim 1, wherein the extracting bus style/frequency information further comprises one of:
   extracting a center pin from a coplanar waveguide, resulting in an intermediate qubit layout having a bus edge removed; and
   removing the center pin from the coplanar waveguide, and performing a logical NOT operation using the qubit layout input, resulting in the intermediate qubit layout having the qubit information removed and retaining the bus style/frequency information.

3. The method of claim 1, wherein extracting qubit information further comprises:
   for each bus end, locating a qubit attached to the bus end; and
   locating the attached qubit in a library of qubit design styles by pattern matching.

4. The method of claim 3, further comprising:
   recognizing and extracting repeating patterns of qubits and connections to the qubits from the qubit layout input, wherein the extracted repeating patterns are rotated, mirrored, and replicated to create a multi-qubit chip floor plan.

5. The method of claim 1, wherein the received qubit layout input further comprises: a manually designed layout, and a qubit layout modified from an existing qubit layout.

6. The method of claim 1, wherein the design rules checking identifies physical errors in the qubit layout input that require correcting before continuing the verifying the qubit layout, including bus width, spacing violation, shorts violations, and misaligned via wires.

7. A computer program product for verifying a quantum circuit layout design, the computer program product comprising a computer readable tangible storage medium having program instructions embodied therewith, the program instructions executable by a computer to cause the computer to perform a method, comprising:
   receiving, by a computer, a qubit layout input generated from a qubit schematic, wherein the qubit schematic includes a plurality of qubits, a plurality of coupling buses, a plurality of readout buses, and a plurality of readout ports;
   performing, by the computer, design rules checking on the qubit layout input, using a predefined set of design rules;
   extracting, by the computer, bus style/frequency and qubit information from the qubit layout input;
   generating, by the computer, a new qubit schematic from the extracted bus style/frequency and qubit information; and
   verifying, by the computer, the qubit layout input, wherein the verifying comprises:
   extracting the qubit schematic from the qubit layout input; and
   matching the extracted qubit schematic to an intended design schematic.

8. The system of claim 7, further comprising:
   recognizing a failure when the generated coupling bus is longer than space available for placement; and
   automatically adjusting the first assembly, wherein the adjusting includes altering a placement of one or more qubits and/or other generated coupling busses until the generated coupling bus fits in the space available for placement.

9. The computer program product of claim 7, wherein the verifying further comprises:
   extracting the qubit schematic from the qubit layout input; and
   matching the extracted qubit schematic to an intended design schematic.

10. The computer program product of claim 7, further comprising:
   recognizing and extracting repeating patterns of qubits and connections to the qubits from the qubit layout input, wherein the extracted repeating patterns are rotated, mirrored, and replicated to create a multi-qubit chip floor plan.

11. The computer program product of claim 7, wherein the received qubit layout input further comprises: a manually designed layout, and a qubit layout modified from an existing qubit layout.

12. The computer program product of claim 7, wherein the design rules checking identifies physical errors in the qubit layout input that require correcting before continuing the verifying the qubit layout, including bus width, spacing violation, shorts violations, and misaligned via wires.

13. A computer system for verifying a quantum circuit layout design, the computer system comprising:
   a computer readable storage device having program instructions embodied therewith, wherein the computer readable storage medium is not a transitory signal per se, the program instructions executable by a processor to cause the processor to perform a method comprising:
   receiving, by a computer, a qubit layout input generated from a qubit schematic, wherein the qubit schematic includes a plurality of qubits, a plurality of coupling buses, a plurality of readout buses, and a plurality of readout ports;
   performing, by the computer, design rules checking on the qubit layout input, using a predefined set of design rules;
   extracting, by the computer, bus style/frequency and qubit information from the qubit layout input;
   generating, by the computer, a new qubit schematic from the extracted bus style/frequency and qubit information; and
   verifying, by the computer, the qubit layout input, wherein the verifying comprises:
   extracting the qubit schematic from the qubit layout input; and
   matching the extracted qubit schematic to an intended design schematic.

14. The computer system of claim 13, wherein the extracting bus style/frequency information further comprises:
   extracting a center pin from a coplanar waveguide, resulting in an intermediate qubit layout having a bus edge removed; and
   removing the center pin from the coplanar waveguide, and performing a logical NOT operation using the qubit layout input, resulting in the intermediate qubit layout having the qubit information removed and retaining the bus style/frequency information.

15. The computer system of claim 13, wherein extracting qubit information further comprises:
   for each bus end, locating a qubit attached to the bus end; and
   locating the attached qubit in a library of qubit design styles by pattern matching.

16. The computer system of claim 13, wherein the received qubit layout input further comprises: a manually designed layout, and a qubit layout modified from an existing qubit layout.

17. The computer system of claim 13, wherein the design rules checking identifies physical errors in the qubit layout input that require correcting before continuing the verifying the qubit layout, including bus width, spacing violation, shorts violations, and misaligned via wires.

* * * * *